(12) United States Patent  
Shum et al.

(10) Patent No.: US 8,895,397 B1
(45) Date of Patent: Nov. 25, 2014

(54) METHODS FOR FORMING THIN FILM STORAGE MEMORY CELLS

(71) Applicant: GLOBALFOUNDRIES Singapore Pte. Ltd., Singapore (SG)

(72) Inventors: Danny Pak-Chum Shum, Singapore (SG); Fook Hong Lee, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/054,084

(22) Filed: Oct. 15, 2013

(51) Int. Cl.
*H01L 21/336* (2006.01)
*H01L 27/115* (2006.01)

(52) U.S. Cl.
CPC .................. *H01L 27/11563* (2013.01)
USPC .......................................................... 438/279

(58) Field of Classification Search
USPC .......................................................... 438/279
See application file for complete search history.

(56) References Cited

U.S. PATENT DOCUMENTS

| | | | | |
|---|---|---|---|---|
| 5,408,115 A * | 4/1995 | Chang | | 257/324 |
| 5,736,442 A * | 4/1998 | Mori | | 438/257 |
| 5,856,223 A * | 1/1999 | Wang | | 438/264 |
| 5,969,383 A * | 10/1999 | Chang et al. | | 257/316 |
| 6,642,103 B2 * | 11/2003 | Wils et al. | | 438/257 |
| 6,828,618 B2 * | 12/2004 | Baker et al. | | 257/311 |
| 6,946,696 B2 * | 9/2005 | Chan et al. | | 257/250 |
| 7,268,042 B2 * | 9/2007 | Hisamoto et al. | | 438/267 |
| 7,361,567 B2 | 4/2008 | Rao et al. | | |
| 7,611,941 B1 * | 11/2009 | Shum et al. | | 438/201 |
| 7,709,315 B2 * | 5/2010 | Tega et al. | | 438/201 |
| 7,759,209 B2 * | 7/2010 | Machida et al. | | 438/305 |
| 7,800,164 B2 | 9/2010 | Muralidhar et al. | | |
| 7,847,331 B2 * | 12/2010 | Ishimaru et al. | | 257/314 |
| 7,871,886 B2 | 1/2011 | Hong et al. | | |
| 7,932,189 B2 | 4/2011 | Merchant et al. | | |
| 7,952,135 B2 * | 5/2011 | Shukuri | | 257/316 |
| 8,076,709 B2 * | 12/2011 | Ishimaru et al. | | 257/314 |
| 8,222,686 B2 * | 7/2012 | Shukuri | | 257/316 |
| 8,329,544 B2 | 12/2012 | Kang et al. | | |
| 8,507,975 B2 * | 8/2013 | Shukuri | | 257/326 |
| 8,575,683 B1 * | 11/2013 | Shih | | 257/319 |
| 8,674,432 B2 * | 3/2014 | Shukuri | | 257/326 |
| 8,716,124 B2 * | 5/2014 | Schultz | | 438/622 |
| 8,722,488 B2 * | 5/2014 | Shih | | 438/257 |
| 2002/0100926 A1 * | 8/2002 | Kim et al. | | 257/296 |
| 2003/0198086 A1 * | 10/2003 | Shukuri | | 365/185.18 |
| 2004/0014284 A1 * | 1/2004 | Kim et al. | | 438/257 |
| 2004/0119107 A1 * | 6/2004 | Hisamoto et al. | | 257/314 |
| 2004/0132247 A1 * | 7/2004 | Kasuya | | 438/257 |
| 2004/0155234 A1 * | 8/2004 | Ishimaru et al. | | 257/10 |
| 2005/0032314 A1 * | 2/2005 | Parekh et al. | | 438/279 |
| 2005/0145920 A1 * | 7/2005 | Chang et al. | | 257/315 |
| 2005/0230736 A1 * | 10/2005 | Ishimaru et al. | | 257/314 |

(Continued)

*Primary Examiner* — Yu-Hsi D Sun
*Assistant Examiner* — Grant Withers
(74) *Attorney, Agent, or Firm* — Ingrassia Fisher & Lorenz, P.C.

(57) ABSTRACT

Methods are provided for manufacturing a thin film storage memory cell. The method includes forming a long select gate on a substrate, and forming thin film storage crystals overlying the long select gate and the adjacent substrate. A left and right control gate are formed on opposite sides of the long select gate, and a long select gate center portion is removed to form a left select gate and a right select gate with a gap therebetween. A drain is formed in the substrate underlying the gap, and a left and right source are formed in the substrate aligned with the left and right control gate.

21 Claims, 6 Drawing Sheets

(56) References Cited

U.S. PATENT DOCUMENTS

| | | |
|---|---|---|
| 2006/0131642 A1* | 6/2006 | Iwata et al. .................... 257/324 |
| 2008/0290401 A1* | 11/2008 | Yasui et al. .................... 257/324 |
| 2009/0179270 A1* | 7/2009 | Chen et al. .................... 257/355 |
| 2010/0320524 A1* | 12/2010 | Shukuri ........................ 257/316 |
| 2010/0322013 A1* | 12/2010 | Ishimaru et al. .......... 365/185.29 |
| 2011/0070725 A1* | 3/2011 | Power et al. .................. 438/591 |
| 2011/0070726 A1* | 3/2011 | Dickenscheid et al. ...... 438/591 |
| 2012/0132978 A1* | 5/2012 | Toba et al. .................... 257/316 |
| 2013/0082315 A1* | 4/2013 | Hosoda et al. ................ 257/315 |
| 2013/0240977 A1* | 9/2013 | Kaneoka et al. .............. 257/325 |
| 2014/0097480 A1* | 4/2014 | Shum et al. ................... 257/314 |

* cited by examiner

METHODS FOR FORMING THIN FILM STORAGE MEMORY CELLS

TECHNICAL FIELD

The technical field generally relates to methods of forming memory cells, and more particularly relates to methods of forming memory cells with thin film storage crystals (also known as silicon nanocrystals).

BACKGROUND

The semiconductor industry is continuously moving toward the fabrication of smaller and more complex microelectronic components with higher performance. Market pressures are driving the industry to produce smaller components, but there is also significant market pressure to reduce costs while making smaller components. There are numerous steps in the manufacture of many integrated circuits, and each step has an associated cost. New methods that eliminate manufacturing steps generally decrease the cost of production, and can also increase the speed of manufacture.

Many integrated circuits include memory cells to store information, and the memory cells are becoming smaller and more complex with the rest of the microelectronic components. There are several different types of memory cells, including flash memory that is non-volatile and re-writable. Non-volatile memory retains stored information even when the memory cell is de-powered, and stored information can be changed when a memory cell is re-writable. Some memory cells for flash memory store information by either charging or draining an electrically isolated component, and the information is recalled by determining if the isolated component is charged or not. One type of memory cell used for flash memory is a thin film storage cell that uses discrete storage crystals, called silicon nanocrystals, to hold the charge. The storage crystals are relatively small, so thin film storage cells are useful for reducing the size of memory cells. One type of memory cell structure using thin film technology is a 1.5 T split-gate cell with a spacer control gate, where one drain is shared with two select gates, and one source is shared with two spacer control gates. These memory cells are typically produced by first manufacturing arrays of select gate transistors, and then forming spacer control gates adjacent to the select gates; thus forming the 1.5 T split gate structure. The process for forming the select gates also produces shoulders in between the control gates overlying the drain, and the shoulders are removed by applying a mask to protect the select gates and using a highly selective etch step to remove the unwanted spacers.

Accordingly, it is desirable to provide methods for producing a memory cell with fewer manufacturing steps. In addition, it is desirable to provide methods for producing a thin film storage memory cell using simplified processes to reduce the complexity of the manufacturing steps involved. Furthermore, other desirable features and characteristics of the present embodiment will become apparent from the subsequent detailed description and the appended claims, taken in conjunction with the accompanying drawings and this background of the invention.

BRIEF SUMMARY

A method is provided for forming a thin film storage memory cell. The method includes forming a long select gate on a substrate, and forming thin film storage crystals overlying the long select gate and the adjacent substrate. Left and right control gates are formed on opposite sides of the long select gate, and a long select gate center portion is removed to form a left select gate and a right select gate with a gap therebetween. A drain is formed in the substrate underlying the gap, and a left and right source are formed in the substrate aligned with the left and right control gate.

In a different embodiment, a method is provided for producing a thin film storage memory cell. The method includes forming a gate dielectric overlying a substrate, and forming a long select gate overlying the gate dielectric. Left and right control gates are formed on opposite sides of the long select gate, and a gap photoresist is formed overlying the long select gate and the adjacent substrate. A long select gate center portion is removed to form a left and a right select gate that define a gap therebetween, and a drain is formed in the substrate underlying the gap.

In yet another embodiment, a method is provided for producing a thin film storage memory cell. A silicon oxide gate dielectric is formed overlying a substrate, and a polysilicon long select gate is formed overlying the gate dielectric. Thin film storage crystals are deposited overlying the long select gate and the substrate, and approximately triangular, polysilicon left and right control gates of are formed on opposite sides of the long select gate such that the thin film storage crystals are positioned between the long select gate and the left and right control gates. A long select gate center portion is removed to form a left select gate and a right select gate that define a gap therebetween. Ions are implanted into the substrate underlying the gap to form a drain, and ions are implanted into the substrate aligned with the left and right control gates to form a left and right source.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Methods for forming thin film storage memory cells according to various embodiments are provided herein. One type of memory cell structure is a split-gate type cell, often referred to as a 1.5 T memory cell, where two gates share a single drain. The split-gate cell includes a left and right select gate on opposite sides of the single drain, with a left and right control gate adjacent to the select gates on the opposite side of the drain. Thin film storage crystals are located underlying the control gates, and between the control gates and the associated select gates. A left and right source are positioned in the substrate adjacent to the control gates on the opposite side of the select gates. A method for forming a split-gate type cell contemplated herein is simplified by first forming a single long select gate that encompasses both the left and right select gates. The thin film storage memory crystals are deposited, and the control gates are formed. A long select gate center portion is then removed to form the left and right select gates, and the drain is formed by implanting ions into the substrate in the gap between the left and right select gates. Removing the central portion of the long select gate simplifies the manufacturing process, because no additional steps are needed to isolate the drain for implantation, or to remove spacer material from over the drain prior to implantation.

Figure 1:
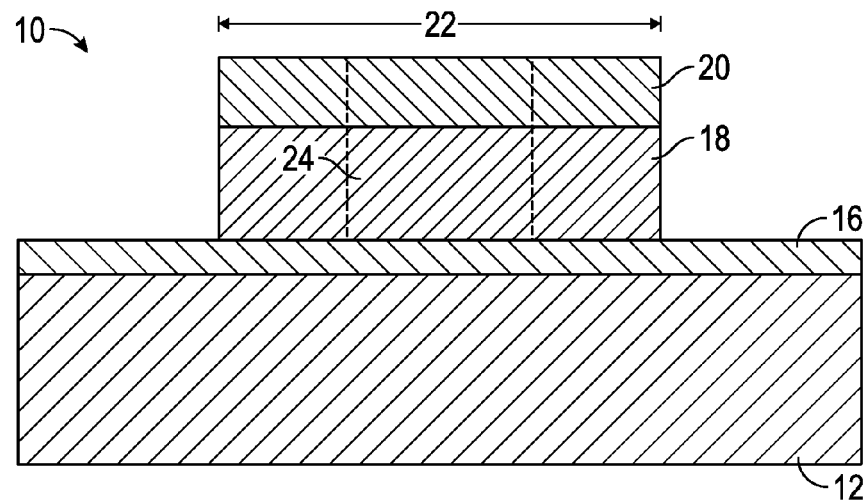
FIGS. 1-7 illustrate, in cross sectional views, methods for fabricating a thin film storage memory cell in accordance with exemplary embodiments.

Reference is now made to the exemplary embodiment illustrated in FIG. 1. The method of producing a thin film storage memory cell 10 includes providing a semiconductor substrate 12. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. Following standard semiconductor techniques, isolations are formed between transistors, such as shallow trench isolations (not shown), and the substrate is cleaned as needed. A gate dielectric 16 is formed overlying the substrate, for example by thermally oxidizing a top surface of the substrate 12 to produce silicon oxide. As used herein, "overlying" means "on" such that the gate dielectric 16 physically contacts the substrate 12, or "over" such that another material layer, such as an interfacial layer, may lie in between the gate dielectric 16 and the substrate 12. The top surface of the substrate 12 is oxidized by exposing it to an oxidizing ambient, such as oxygen or steam, at a temperature of about 900 degrees centigrade (° C.) to about 1,100° C. Alternatively, the gate dielectric 16 could be other insulating materials, such as silicon nitride, silicon oxynitride or the like, or a high dielectric constant insulator ("high-k dielectric") deposited by chemical vapor deposition, atomic layer deposition, or other methods.

After the gate dielectric 16 is formed, a long select gate 18 is formed overlying the gate dielectric 16. In an exemplary embodiment, the long select gate 18 is formed by depositing polycrystalline silicon (hereinafter "polysilicon") overlying the gate dielectric 16, then depositing a hard mask 20 overlying the polysilicon. The polysilicon can be deposited by low pressure chemical vapor deposition in a silane environment, and the hard mask 20 can be silicon nitride, for example, which is deposited by low pressure chemical vapor deposition with ammonia and dichlorosilane. A layer of photoresist (not shown) is then deposited overlying the hard mask 20, such as by spin coating, and the photoresist is patterned with a mask and electromagnetic radiation (light). In an exemplary embodiment, the deep ultraviolet (DUV) electromagnetic radiation is provided by a KrF laser at about a 248 nanometer wavelength, or by an ArF laser at about a 193 nanometer wavelength. The patterned photoresist is developed, such as with a solvent, to expose the hard mask 20 except for at the locations that overlie the long select gate 18. The exposed hard mask 20, the underlying polysilicon, and the underlying gate dielectric 16 are then removed to leave the long select gate 18 and the portion of the hard mask 20 directly overlying the long select gate 18. The exposed hard mask 20 can be removed with a plasma reactive ion etch using, for example, hydrogen and nitrogen trifluoride, and the exposed polysilicon can be removed by etching with difluoromethane and sulfur hexafluoride. The gate dielectric 16 can be removed with a reactive ion etch using carbon tetrafluoride in a hydrogen plasma. Other well known etching processes can also be used as appropriate, and as known by those skilled in the art. The photoresist is removed, such as with an oxygen containing plasma, after the hard mask 20 and the polysilicon are removed. An antireflective coating (not illustrated) can also be formed overlying the polysilicon of the long select gate 18 to improve the photoresist patterning accuracy. The long select gate 18 has a long select gate length 22, indicated by a double headed arrow, that is more than twice the length desired for the select gates that will remain when the thin film storage memory cell 10 is complete. The long select gate 18 also has a sacrificial long select gate center portion 24, which is described more fully below.

Figure 2:
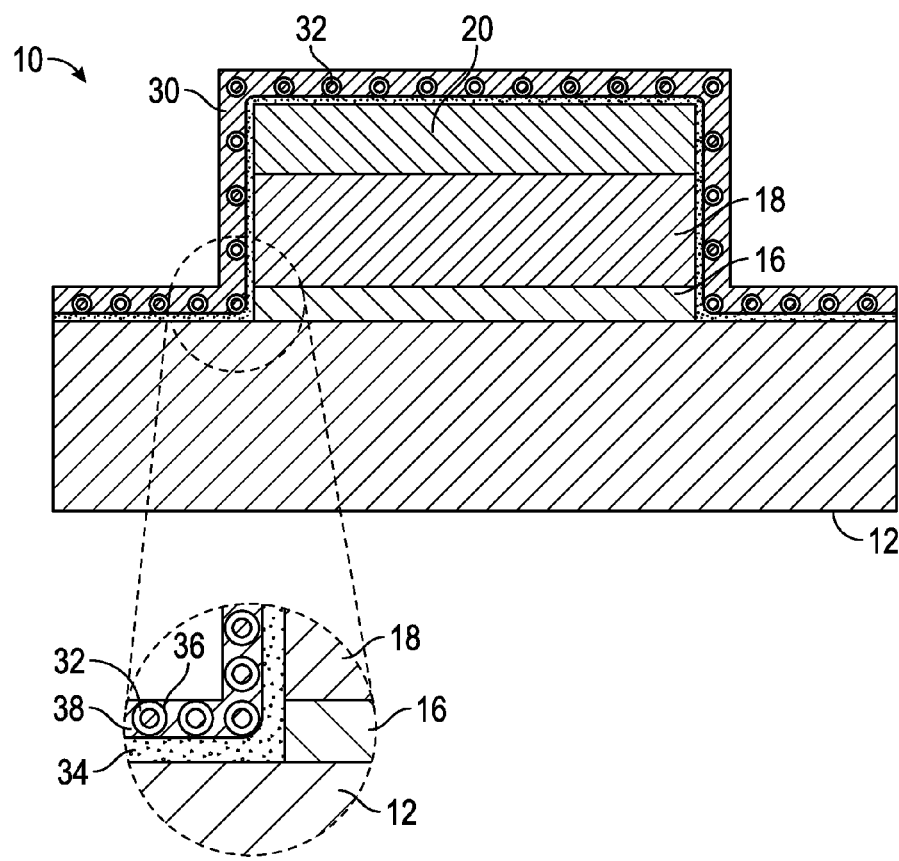

Referring now to FIG. 2, a thin film layer 30 is formed overlying the substrate 12, the hard mask 20, and the vertical side portions of the long select gate 18. The thin film layer 30 has several different components, described below, including isolated silicon nanocrystals 32 that serve as storage nodes for electrical charges in the thin film storage memory cell 10.

Several known methods can be used to form the thin film layer 30, and alternate methods can be used in different embodiments. In an exemplary embodiment, a bottom dielectric layer 34 of oxynitride is uniformly deposited overlying the thin film memory storage cell 10, including the substrate 12, the long select gate 18, and the remaining hard mask 20, such as by plasma enhanced chemical vapor deposition using nitrous oxide and silane. The nanocrystals 32 are then formed on the bottom dielectric layer 34. Amorphous silicon is deposited on the bottom dielectric layer 34, such as by chemical vapor deposition, plasma enhanced chemical vapor deposition, or sputtering. In one exemplary embodiment, the amorphous silicon is deposited by chemical vapor deposition at about 300° C. to about 550° C. for about 10 to 150 seconds in an ambient of nitrogen and disilane at a ratio of disilane to nitrogen of about 11/5,000. The amorphous silicon is then annealed, such as by heating to about 600° C. to about 1,050° C. for about 1 to 60 seconds in a nitrogen ambient, to form a plurality of nanocrystals 32. A second anneal, such as from about 300° C. to about 1,050° C. for about 1 to 60 seconds in an oxygen ambient, is then performed to reduce the number of small nanocrystals 32, because some of the smaller nanocrystals 32 will either fully oxidize or be absorbed by another nanocrystal 32 to increase in size. Silicon is then deposited overlying the nanocrystals 32 and the bottom dielectric layer 34, such as by chemical vapor deposition at about 300° C. to about 550° C. for about 10 to 150 seconds in an ambient of nitrogen and disilane with a concentration ratio of disilane to nitrogen of about 11/5,000. Another anneal is performed to ensure the existing nanocrystals 32 absorb the silicon just deposited, such as by heating from about 600° C. to about 1,050° C. for about 1 to 60 seconds in a nitrogen ambient. This is followed by another anneal to grow a nanocrystal dielectric surface layer 36 of silicon oxide around the nanocrystals 32, such as by heating from about 300° C. to about 1,050° C. for about 1 to 60 seconds in an oxygen ambient. The resulting nanocrystals 32 are about 0.1 to about 50 nanometers in diameter, and are encased in the nanocrystal dielectric surface layer 36.

A top dielectric layer 38 is then deposited overlying the bottom dielectric layer 34 and the nanocrystals 32. A wide variety of dielectric materials can be used in the top dielectric layer 38, including but not limited to silicon oxide, silicon nitride, or other insulating materials such as high dielectric materials (high K materials). In an exemplary embodiment, a top dielectric layer 38 of silicon oxide is deposited by chemical vapor deposition using silane in an oxygen ambient. The top dielectric layer 38 overlies the nanocrystals 32, but also fills the space between adjacent nanocrystals 32 such that the nanocrystals 32 are encased in dielectric material by the nanocrystal dielectric surface layer 36, the top dielectric layer 38, and the bottom dielectric layer 34. Therefore, the nanocrystals 32 save and store an electric charge until a sufficient electric voltage causes the charge to tunnel across the surrounding dielectrics. In the same manner, a sufficient electric voltage is needed to charge the nanocrystals 32 from an uncharged state.

Figure 3:
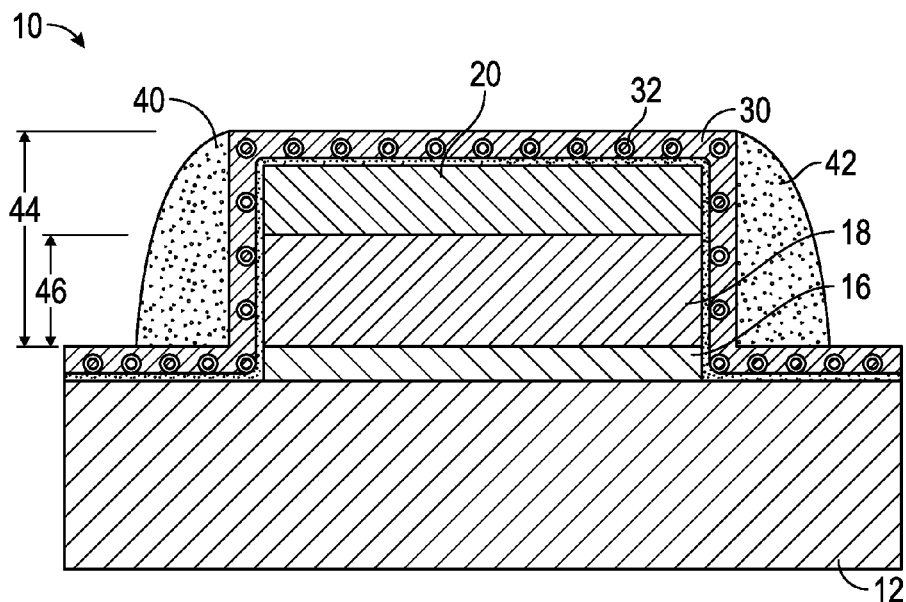

Reference is now made to FIG. 3. A left control gate 40 and a right control gate 42 are formed on opposite sides of the long select gate 18, with the thin film layer 30 positioned between the long select gate 18 and the left and right control gates 40, 42. The left and right control gates 40, 42 are formed as spacers on opposite sides of the long select gate 18, so the left and right control gates 40, 42 have an approximately triangular shape. The approximately triangular shape of the left and right control gates 40, 42 is not necessarily a perfect triangle, and in many embodiments the hypotenuse tends to have a bowed or bent shape, as illustrated, but the left and right control gates 40, 42 still have a generally triangular shape with 3 distinct sides. The spacer form of the left and right control gates 40, 42 facilitates manufacture of the thin film storage memory cell 10 in a small space, because the left and right control gates 40, 42 do not extend very far beyond the long select gate 18. The thin film layer 30 serves as a dielectric to electrically separate the long select gate 18 from the left and right control gates 40, 42. In an exemplary embodiment, the left and right control gates 40, 42 are formed by depositing polysilicon overlying the thin film layer 30, and then anisotropically etching the polysilicon with a reactive ion etch using sulfur hexafluoride. The anisotropic etchant stops before etching the substrate 12 and the thin film layer 30 beyond the long select gate 18 and the left and right control gates 40, 42. In an alternate embodiment (not shown), the thin film layer 30 is removed overlying the substrate 12 beyond the left and right control gates 40, 42.

The left and right control gates 40, 42 extend to a control gate height 44, indicated by a double headed arrow, that is greater than a select gate height 46, indicated by a double headed arrow, because the left and right control gates 40, 42 extend to about the level of the hard mask 20 overlying the long select gate 18. The thin film layer 30 may or may not be present overlying the hard mask 20 in various embodiments, and the thin film layer 30 is relatively thin compared to the hard mask 20 and the long select gate 18, so it has little impact on the control gate height 44. The control gate height 44 extends from the thin film layer 30 to the highest point of the approximately triangular left and/or right control gates 40, 42, and the select gate height 46 is the distance from the thin film layer 30 to the interface between the hard mask 20 and the long select gate 18.

Figure 4:
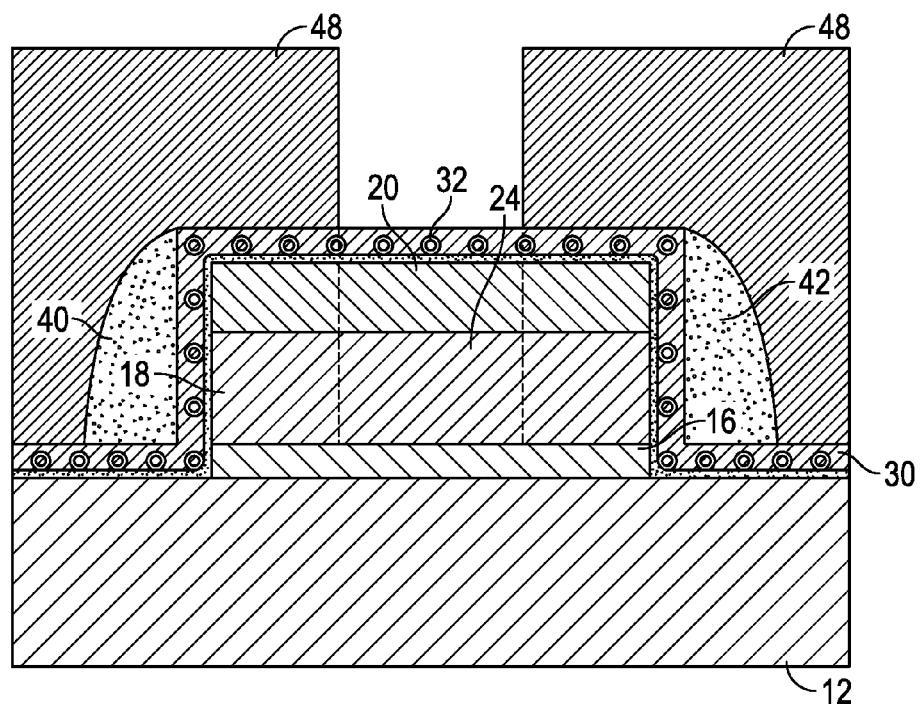

Referring now to FIG. 4, a gap photoresist 48 is formed overlying the long select gate 18 and hard mask 20, the left and right control gates 40, 42, and the substrate 12. The gap photoresist 48 is then patterned and developed to expose an area of the thin film layer 30 overlying the long select gate center portion 24. The gap photoresist 48 can be deposited by spin coating, developed by exposing selected areas to light, and developed with an organic solvent to remove the desired areas with an organic solvent.

Figure 5:
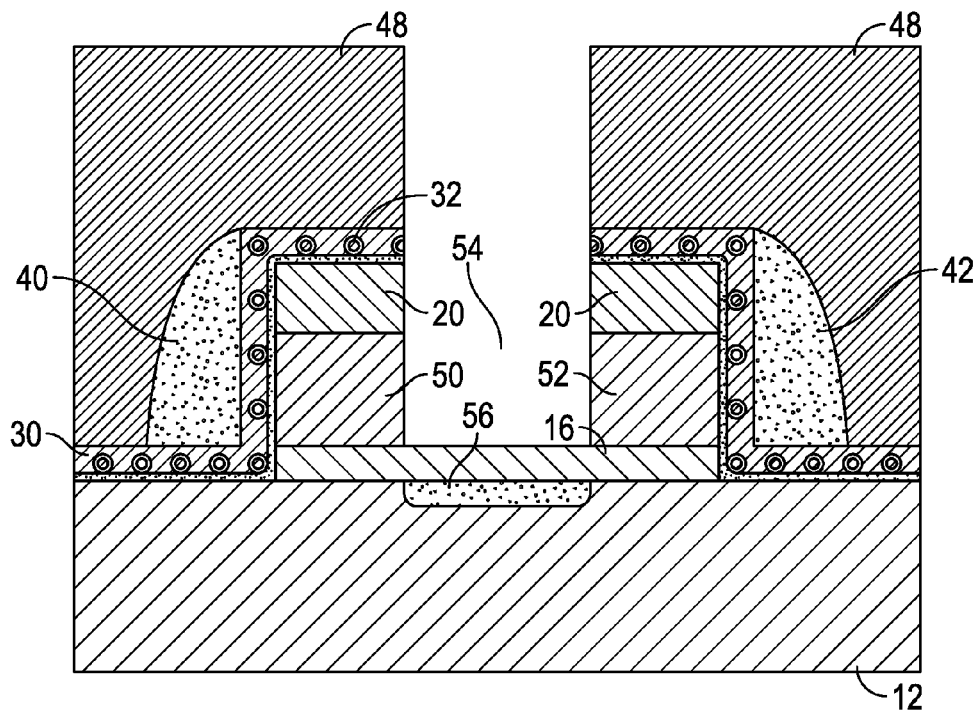

Reference is now made to FIG. 5, with continuing reference to FIG. 4. The area of the thin film layer 30 and the hard mask 20 overlying the long select gate center portion 24, along with the long select gate center portion 24, are removed to leave a left select gate 50 and a right select gate 52. In an exemplary embodiment, the long select gate center portion 24 is removed by selective etching, and the etching is controlled to leave the gate dielectric 16 overlying the substrate 12 in a gap 54 where the long select gate center portion 24 was removed. The long select gate center portion 24 can be removed using a multi-step etching process to remove the various layers. The thin film layer 30, if present, is removed by a wet etch with dilute hydrofluoric acid, and the hard mask 20 is removed with a reactive ion etch using carbon tetrafluoride, difluoromethane, and oxygen. The long select gate center portion 24 is etched by a reactive ion etch using known etchants, such as sulfur hexafluoride or hydrogen bromide. The gap 54 is formed where the long select gate center portion 24 was positioned, so the left and right select gates 50, 52 define the gap 54 over the substrate 12.

A drain 56 is formed in the substrate 12 underlying the gap 54 by implanting conductivity-determining ions to produce a drain dopant profile. In an exemplary embodiment, the drain 56 is formed by implanting conductivity-determining ions into the substrate 12 through the gate dielectric 16. The ions are either "N" type, such as phosphorus or arsenic, or "P" type, such as boron or boron difluoride depending on the type of thin film storage memory cell 10 desired, but other types of ions can also be used. The gap photoresist 48 is left in place during ion implantation, so the gap photoresist 48 serves as a mask to block ion implantation in the remaining portions of the thin film storage memory cell 10, the substrate 12, or any other electronic components on the substrate 12.

In some embodiments, the drain 56 is more heavily implanted than the sources that are not yet formed, and which are described more fully below, to provide a thin film storage memory cell 10 that has asymmetrical source/drain junctions. The asymmetrical source/drain junctions provide superior electrical characteristics over more conventional source/drain junctions that are symmetrical. Asymmetrical source/drain junctions increase the flexibility to fine tune the source/drain doping profile according to the memory cell device bias scheme, and symmetrical source/drain junctions require additional masks to separate the junctions to carry out doping profile optimizations. The drain 56 is self-aligned with the left and right select gates 50, 52, because the substrate 12 under the gap 54 is exposed to ion implantation beginning at the edges of the left and right select gates 50, 52. The gap photoresist 48 first serves as an etch mask to remove the long select gate center portion 24, and then serves as an implant mask during the drain implantation, so the gap photoresist 48 is used in two separate steps. The re-use of the gap photoresist 48 simplifies the manufacturing process. The drain 56 is implanted after the long select gate center portion 24 is removed, so no additional material need be removed or added to prepare the drain 56 for implantation or proper alignment with the left and right select gates 50, 52. The formation of a long select gate 18, and the subsequent removal of the long select gate center portion 24, provides a simplified manufacturing process with relatively few steps.

Figure 6:
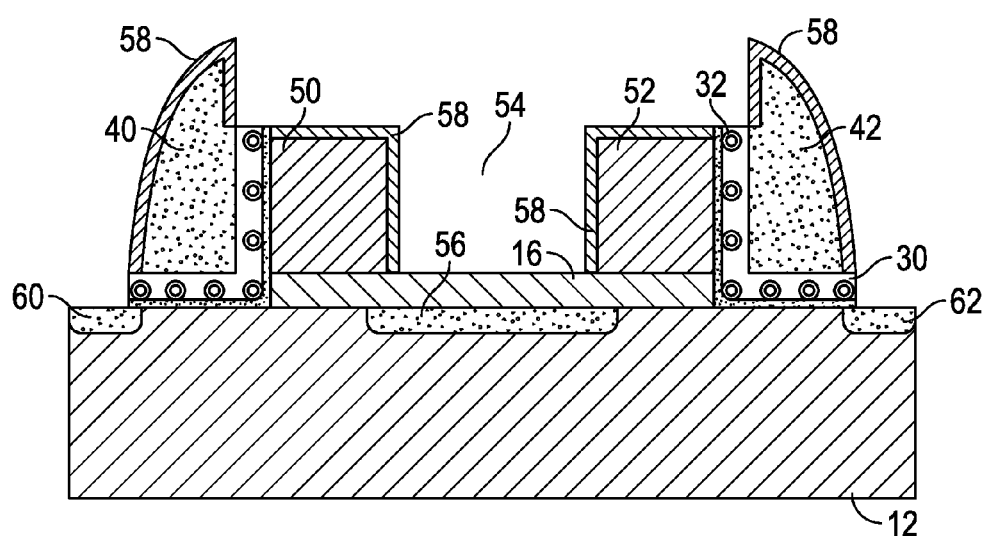

Reference is now made to an exemplary embodiment illustrated in FIG. 6, with continuing reference to FIG. 5. The gap photoresist 48 is removed, such as by an oxygen containing plasma, and the substrate 12 and attached components are wet cleaned. The thin film layer 30, if present at this point, and the hard mask 20 positioned over the left and right select gates 50, 52 are removed, and a side wall dielectric 58 is formed on the exposed surfaces of the left and right control gates 40, 42 and the left and right select gates 50, 52 (including the side surfaces and exposed top surfaces that are horizontal). In an exemplary embodiment, the thin film layer 30 is removed by a wet etch using dilute hydrofluoric acid in embodiments where the thin film layer 30 was not previously removed. The thin film layer 30 is also removed from over the substrate 12 in areas where the thin film layer 30 is exposed, such as to the left of the left control gate 40 and to the right of the right control gate 42, during the same etching process that removes the thin film layer 30 from over the left and right select gates 50, 52. The hard mask 20 is removed by reactive ion etching using carbon tetrafluoride, difluoromethane, and oxygen. In one embodiment, the side wall dielectric 58 is silicon oxide that is formed by oxidizing the exposed polysilicon on the left and right control gates 40, 42 and the left and right select gates 50, 52, such as by exposure to an oxidizing ambient at elevated temperatures. The side wall dielectric 58 insulates the left and right control gates 40, 42 and the left and right select gates 50, 52 to aid in the function of the thin film storage memory cell 10.

A left source 60 and a right source 62 are formed in the substrate 12 aligned with the left and right control gates 40, 42, respectively, where the left and right sources 60, 62 are on the opposite side of the left and right control gates 40, 42 as the left and right select gates 50, 52. The left and right sources 60, 62 are formed with a conductivity-determining ion(s) at a concentration that produces a source dopant profile. In an exemplary embodiment, the left and right sources 60, 62 are formed by ion implantation using the same type of conductivity-determining ions as in the drain 56, and at a lower concentration than the initial implant into the drain 56, as described above. The left and right sources 60, 62, as well as the drain 56, are counter doped in some embodiments, so the type of dopant used to form the left and right sources 60, 62 and the drain 56 are different than a low concentration dopant used in the substrate 12. For example, of the substrate 12 has a light concentration of "P" type dopant, the left and right sources 60, 62 are implanted with an "N" type dopant, and vice versa. A blanket implant to the memory cell array can be used for the left and right sources 60, 62, so no mask is present and the ions used in the left and right sources 60, 62 are also implanted into the drain 56. In one embodiment, the left and right sources 60, 62 are implanted to a lower concentration and at a higher energy than the drain 56. This produces a left and right source 60, 62 dopant profile lower than the drain dopant profile, which is one type of an asymmetrical thin film storage memory cell 10, so the dopant profile is different in the drain 56 and the left and right sources 60, 62. A layer of photoresist (not shown) masks logic areas, high voltage areas (not shown), and other electronic components used in an integrated circuit with the thin film storage memory cell 10 during the left and right source 60, 62 implantation. The layer of photoresist is removed after use, as described above.

In another embodiment, the left and right source 60, 62 are implanted into the substrate 12 early in process, so the left and right source 60, 62 are formed before the drain 56. For example, the left and right source 60, 62 are implanted after the formation of the long select gate 18, as illustrated in FIG. 1 with continuing reference to FIG. 6, where the formation of the left and right source 60, 62 is not shown in FIG. 1. The drain 56 is not implanted at this time, because the long select gate center portion 24 overlies it. Other electronic components, such as other logic areas and high voltage areas (not shown) can remain covered by the material used to form the long select gate 18, such as polysilicon, so the other electronic components are not implanted either. This early implantation of the left and right source 60, 62 can eliminate the need for a mask to protect the other electronic components, and thereby reduce the number of manufacturing steps. In this embodiment, the left and right source 60, 62 are positioned under the left and right control gate 40, 42, because the left and right source 60, 62 are formed before the left and right control gate 40, 42.

Figure 7:
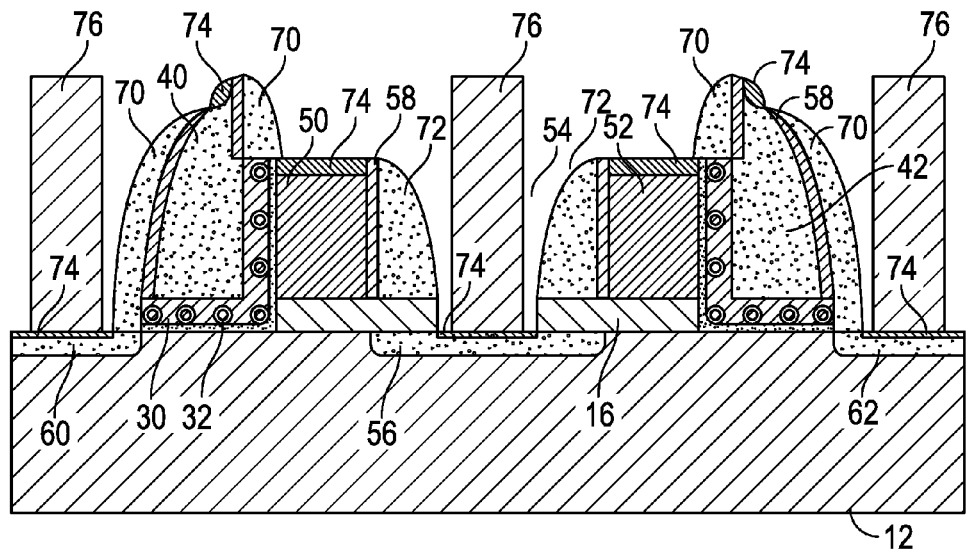

Reference is now made to FIG. 7. Dielectric control gate spacers 70 and dielectric select gate spacers 72 are formed during the logic spacer process along the side surfaces of the left and right control gates 40, 42 and the left and right select gates 50, 52, respectively. The dielectric control and select gate spacers 70, 72 further insulate the left and right control and select gates 40, 42, 50, 52, and aid in proper positioning of electrical contacts (described below.) The dielectric control gate spacers 70 and dielectric select gate spacers 72 may be formed at the same time, such as by deposition of silicon nitride over the exposed surfaces of the thin film storage memory cell 10, and subsequent anisotropic etching. Silicon nitride is deposited by low pressure chemical vapor deposition with ammonia and dichlorosilane, and then anisotropically etched by reactive ion etching with carbon tetrafluoride, difluoromethane, and oxygen. The anisotropic etch leaves some of the silicon nitride along the vertical or near-vertical surfaces of the left and right control and select gates 40, 42, 50, 52 to form the dielectric control and select gate spacers 70, 72.

Contact points 74 are then silicided to improve electrical connectivity. The contact points 74 include the upper, horizontal surfaces of: the left and right control gates 40, 42; the left and right select gates 50, 52; the drain 56; and the left and right sources 60, 62. Any remaining dielectric over the contact points 74 is removed, for example by a reactive ion etch with hydrofluoric acid. Metal is then deposited overlying the contact points 74, such as depositing nickel by chemical vapor deposition, and a silicide is formed upon annealing the deposited metal with the silicon at the contact points 74. Contacts 76 are then formed to electrically connect the contact points 74, and the associated portions of the thin film storage memory cell 10, with other electronic components in an integrated circuit. The contacts 76 are formed using standard techniques well known to those skilled in the art. The thin film storage memory cell 10 is then connected to an integrated circuit and utilized for memory using techniques well known to those skilled in the art.

Figure 8:
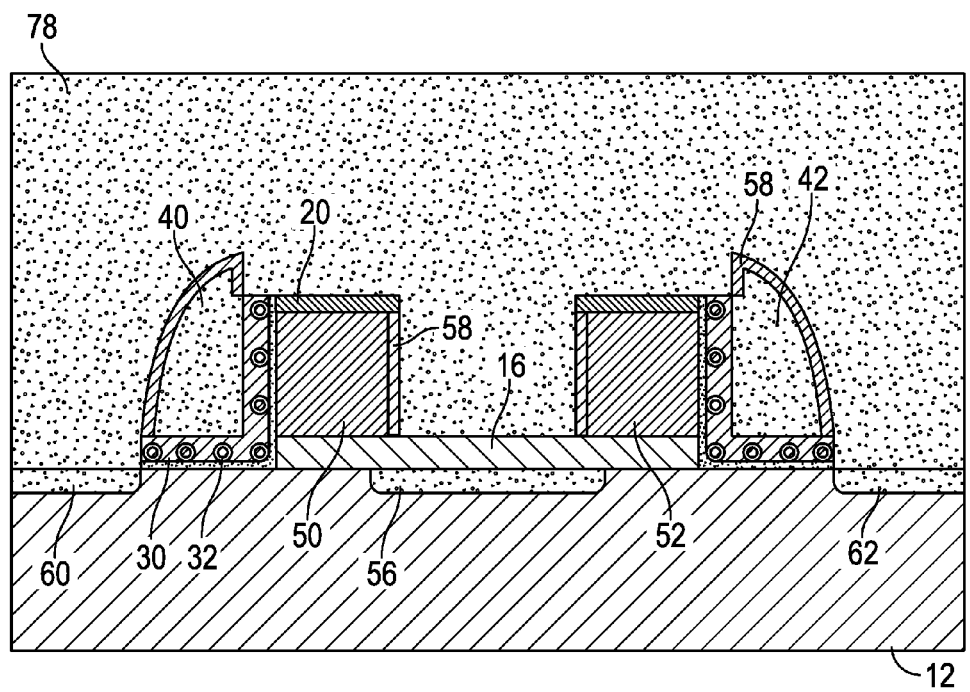
FIGS. 8-11 illustrate, in cross sectional views, alternate exemplary embodiments of fabricating a thin film storage memory cell.

Referring now to FIG. 8, an alternate embodiment of the method for producing the thin film storage memory cell 10 is illustrated. The alternate embodiment follows the same steps as described above through the removal of the thin film layer 30 overlying the hard mask 20 and the substrate 12, similar to FIG. 6 except with the hard mask 20 still in place. In an exemplary embodiment, the exposed silicon surfaces of the left and right control gates 40, 42 and left and right select gates 50, 52 are oxidized to produce the side wall dielectric 58. The top surface of the left and right select gates 50, 52 is covered by the hard mask 20, so that top surface is not oxidized. A layer of photoresist (not shown) is deposited, patterned, and developed to expose the left and right source 60, 62 and the drain 56, and conductivity-determining ions are then implanted, as described above. The photoresist is removed, and a spacer dielectric 78 is blanket deposited overlying the thin film storage memory cell 10 and the substrate 12. In some embodiments, the spacer dielectric 78 is low temperature silicon oxide formed by chemical vapor deposition of tetraethylorthosilicate (TEOS) or ozone TEOS or low temperature oxide (LTO). A layer of photoresist (not shown)

may be deposited, patterned, and developed to protect logic areas separate from the thin film storage memory cell 10.

Figure 9:
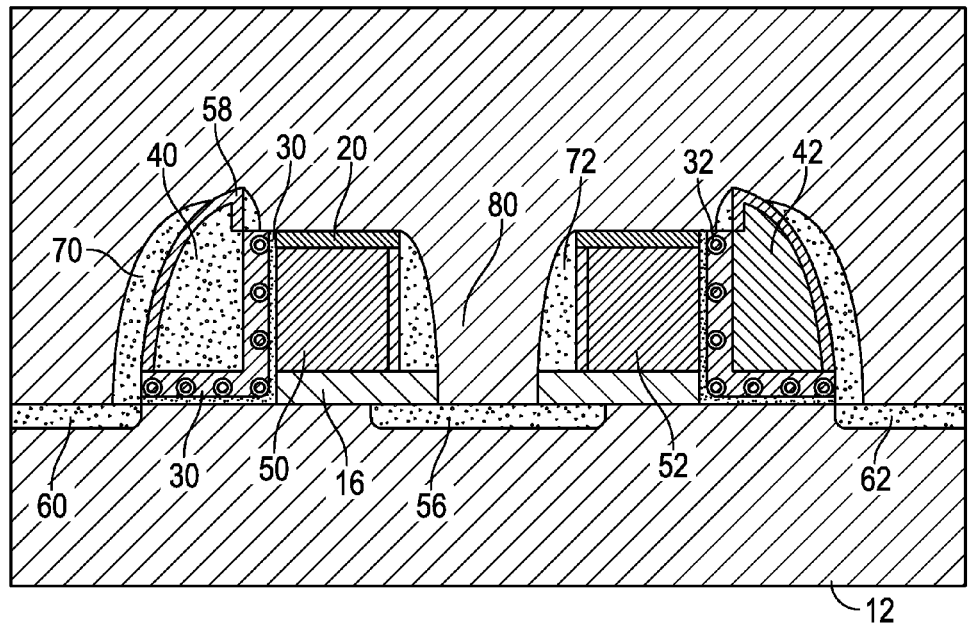

Reference is now made to FIG. 9, with continuing reference to FIG. 8. The dielectric control gate spacers 70 and the dielectric select gate spacers 72 are formed along the side surfaces of the left and right control and select gates 40, 42, 50, 52. The spacer dielectric 78 is anisotropically etched, such as by reactive ion etching with hydrofluoric acid, to form the dielectric control gate spacers 70 and the dielectric select gate spacers 72. The etching of the spacer dielectric 78 is continued to remove the gate dielectric 16 overlying the drain 56 as well. If photoresist was used to protect logic areas separate from the thin film storage memory cell 10, it is removed. Polysilicon is deposited overlying the thin film storage memory cell 10 and adjacent areas to form a plug 80 overlying the drain 56 and between the left and right select gates 50, 52.

Figure 10:
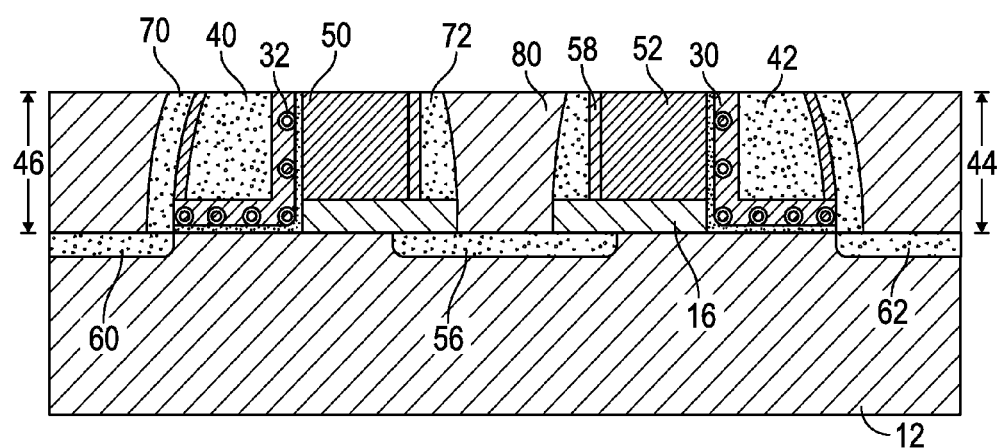

Referring now to FIG. 10, the control gate height 44 is reduced to about the same as the select gate height 46. In an exemplary embodiment, the thin film storage memory cell 10 is polished by chemical mechanical planarization to remove an upper portion of the left and right control gates 40, 42, and also to remove the hard mask 20 overlying the left and right select gates 50, 52. An upper portion of the left and right select gates 50, 52 may also be removed. The plug 80, which is electrically connected to the drain 56, is smoothed and lowered to the same level as the upper surface of the left and right select gates 50, 52.

Figure 11:
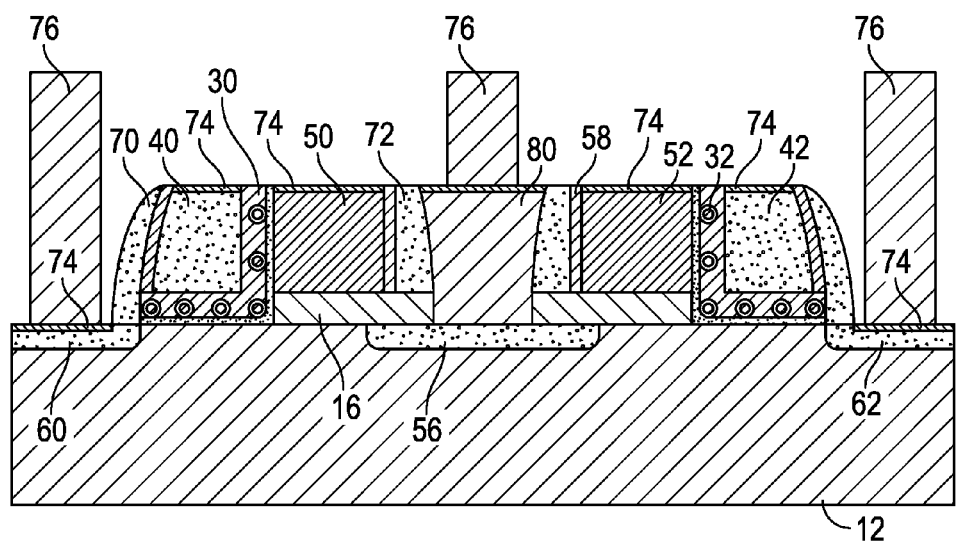

Reference is now made to FIG. 11. A layer of photoresist (not shown) is deposited, patterned, and developed to cover the plug 80 and expose the polysilicon over the left and right sources 60, 62 and other areas of the integrated circuit. The polysilicon over the left and right sources is removed, such as by reactive ion etching with sulfur hexafluoride. The photoresist is removed from over the plug 80, so the upper surface of the left and right sources 60, 62, the left and right control gates 40, 42, the left and right select gates 50, 52, and the plug 80 are exposed. Metal is then deposited overlying these exposed upper surfaces, such as depositing nickel by chemical vapor deposition, and the metal and exposed silicon areas form a silicide upon annealing. The silicided areas are the contact points 74, and contacts 76 are formed in electrical connection with the contact points 74 using standard techniques well known to those of skill in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of forming a thin film storage memory cell, the method comprising:
   forming a long select gate on a substrate;
   forming thin film storage crystals overlying the long select gate and the substrate adjacent to the long select gate;
   forming a left control gate and a right control gate on opposite sides of the long select gate;
   removing a long select gate center portion to form a left select gate and a right select gate, wherein the left select gate and the right select gate define a gap therebetween;
   forming a drain in the substrate directly underlying the gap; and
   forming a left source in the substrate aligned with the left control gate and a right source in the substrate aligned with the right control gate.

2. The method of claim 1 further comprising:
   depositing a gap photoresist overlying the long select gate and the substrate adjacent to the left control gate and the right control gate prior to removing the long select gate center portion; and
   removing the gap photoresist from the substrate adjacent to the left control gate and the right control gate after forming the drain in the substrate.

3. The method of claim 1 wherein forming the left source in the substrate aligned with the left control gate and the right source in the substrate aligned with the right control gate further comprises forming the left source and the right source with a source dopant profile different than a drain dopant profile for the drain.

4. The method of claim 1 wherein forming the left control gate and the right control gate further comprises:
   depositing polysilicon overlying the long select gate and the substrate; and
   removing the polysilicon from over the long select gate and the substrate such that the left control gate and the right control gate comprise polysilicon with an approximately triangular shape.

5. The method of claim 1 wherein forming the left control gate and the right control gate further comprises forming the left control gate and the right control gate to a control gate height, wherein the control gate height is greater than a select gate height.

6. The method of claim 5 further comprising removing an upper portion of the left control gate and the right control gate such that the control gate height is about the same as the select gate height.

7. The method of claim 1 further comprising:
   forming a dielectric select gate spacer within the gap along a side surface of the left select gate and the right select gate;
   forming a plug within the gap; and
   forming a contact overlying the plug.

8. The method of claim 1 further comprising forming a gate dielectric overlying the substrate prior to forming the long select gate.

9. The method of claim 1 further comprising:
   forming dielectric control gate spacers adjacent to the left control gate and the right control gate;
   forming dielectric select gate spacers within the gap along side surfaces of the left select gate and the right select gate; and
   forming contacts to the left source, the right source, and the drain.

10. The method of claim 1 wherein forming the thin film storage crystals further comprises:
    depositing a lower thin film dielectric prior to forming the thin film storage crystals; and
    depositing an upper thin film dielectric after forming the thin film storage crystals.

11. A method of forming a thin film storage memory cell, the method comprising:
    forming a gate dielectric overlying a substrate;
    forming a long select gate overlying the gate dielectric;
    forming a left control gate and a right control gate on opposite sides of the long select gate;
    forming a gap photoresist overlying the long select gate and the substrate adjacent to the long select gate;

removing a long select gate center portion to form a left select gate and a right select gate defining a gap therebetween; and forming a drain in the substrate directly underlying the gap.

12. The method of claim 11 further comprising:

Forming a gap photoresist overlying the long select gate and the substrate adjacent to the long select gate prior to removing the long select gate center portion; and wherein forming the drain in the substrate further comprises forming the drain in the substrate while the gap photoresist is overlying the substrate adjacent to the long select gate.

13. The method of claim 11 further comprising forming a left source in the substrate aligned with the left control gate and a right source in the substrate aligned with the right control gate, and wherein the left source and the right source have a source dopant profile different than a drain dopant profile for the drain.

14. The method of claim 11 further comprising forming a left source in the substrate aligned with the left select gate and underneath the left control gate, and forming a right source in the substrate aligned with the right select gate and underneath the right control gate.

15. The method of claim 11 wherein forming the left control gate and the right control gate further comprise forming the left control gate and the right control gate to a control gate height, wherein the control gate height is greater than a select gate height.

16. The method of claim 15 further comprising removing an upper portion of the left control gate and the right control gate such that the control gate height is about the same as the select gate height.

17. The method of claim 11 wherein forming the left control gate and the right control gate further comprises forming the left control gate and the right control gate with an approximately triangular shape.

18. The method of claim 11 further comprising:

forming a dielectric select gate spacer along a side surface of the left select gate and the right select gate within the gap;

depositing a plug within the gap; and forming a contact overlying the plug.

19. The method of claim 11 further comprising:

forming thin film storage crystals overlying the long select gate and the substrate adjacent to the long select gate.

20. A method of forming a thin film storage memory cell, the method comprising:

forming a gate dielectric overlying a substrate, wherein the gate dielectric comprises silicon oxide;

forming a long select gate overlying the gate dielectric, where the long select gate comprises polysilicon;

depositing thin film storage crystals overlying the long select gate and the substrate;

forming a left control gate and a right control gate on opposite sides of the long select gate, wherein the left control gate and the right control gate have an approximately triangular shape and comprise polysilicon, wherein the thin film storage crystals are positioned between the left control gate and the long select gate, and the thin film storage crystals are positioned between the right control gate and the long select gate;

removing a long select gate center portion to form a left select gate and a right select gate defining a gap therebetween;

implanting ions into the substrate directly underlying the gap to form a drain; and implanting ions into the substrate aligned with the left control gate and the right control gate to form a left source and a right source.

21. The method of claim 20 further comprising:

depositing a gap photoresist overlying the long select gate and the substrate adjacent to the long select gate prior to removing the long select gate center portion; and removing the gap photoresist after implanting the ions into the substrate underlying the gap to form the drain.

* * * * *